United States Patent [19]
Manning

[11] Patent Number: 5,835,440
[45] Date of Patent: Nov. 10, 1998

[54] MEMORY DEVICE EQUILIBRATION CIRCUIT AND METHOD

[75] Inventor: Troy A. Manning, Boise, Id.

[73] Assignee: Micron Technology, Inc., Boise, Id.

[21] Appl. No.: 907,275

[22] Filed: Aug. 6, 1997

[51] Int. Cl.$^6$ .................. G11C 8/00; G11C 7/02
[52] U.S. Cl. .................. 365/230.06; 365/233.5; 365/207
[58] Field of Search .................. 365/230.06, 233.5, 365/203, 207, 208

[56] References Cited

U.S. PATENT DOCUMENTS

5,732,036  3/1998  Meeritt et al. .................. 365/203
5,748,556  5/1998  Iyengar .................. 365/230.06

*Primary Examiner*—David C. Nelms
*Assistant Examiner*—Trong Phan
*Attorney, Agent, or Firm*—Seed and Berry LLP

[57] ABSTRACT

An equilibration driver circuit provides an equilibration signal on a node in a dynamic random access memory (DRAM). The node is coupled to an equilibration circuit in the DRAM which equalizes voltage levels on complementary pairs of input/output lines in the DRAM in response to the equilibration signal. The equilibration driver circuit comprises an address transition detection circuit having an input terminal adapted to receive a column address signal. The address transition detection circuit is operable to output a pulse signal having a predetermined duration in response to a transition of the column address signal from one logic level to the complementary logic level. A switching circuit has an input terminal receiving the pulse signal and an equilibration terminal coupled to the node. The switching circuit is operable in a first mode to couple the equilibration terminal to a first reference voltage in response to the pulse signal being active. The switching circuit is operable in a second mode to couple the equilibration terminal through a low impedance circuit to a second reference voltage subsequent to the first mode. In a third mode, the switching circuit is operable to couple the equilibration terminal through a high impedance circuit to the second reference voltage subsequent to the second mode.

54 Claims, 7 Drawing Sheets

MEMORY DEVICE EQUILIBRATION CIRCUIT AND METHOD

TECHNICAL FIELD

The present invention relates generally to equilibration circuitry for a memory device and, more specifically, to a high speed circuit for equilibrating input/output (I/O) lines in a memory device.

BACKGROUND OF THE INVENTION

A conventional DRAM is an asynchronous device, meaning that there is no external clock applied to the DRAM to synchronize its internal operation during a data transfer operation. In lieu of an external clock, conventional DRAMs utilize control signals and address transition detectors (ATDs) to generate initial pulses which are used by control circuitry to sequentially activate and equilibrate various components of the DRAM during a read or write data transfer operation. Each ATD is typically coupled to receive a column address signal from an address pin of the DRAM and operates to output a pulse signal when the column address signal transitions from one logic state to the complementary logic state. The outputs from the ATDs are typically used to control equilibration and biasing of I/O lines that carry data between input/output buffers and the memory-cell array of the DRAM.

Figure 1:
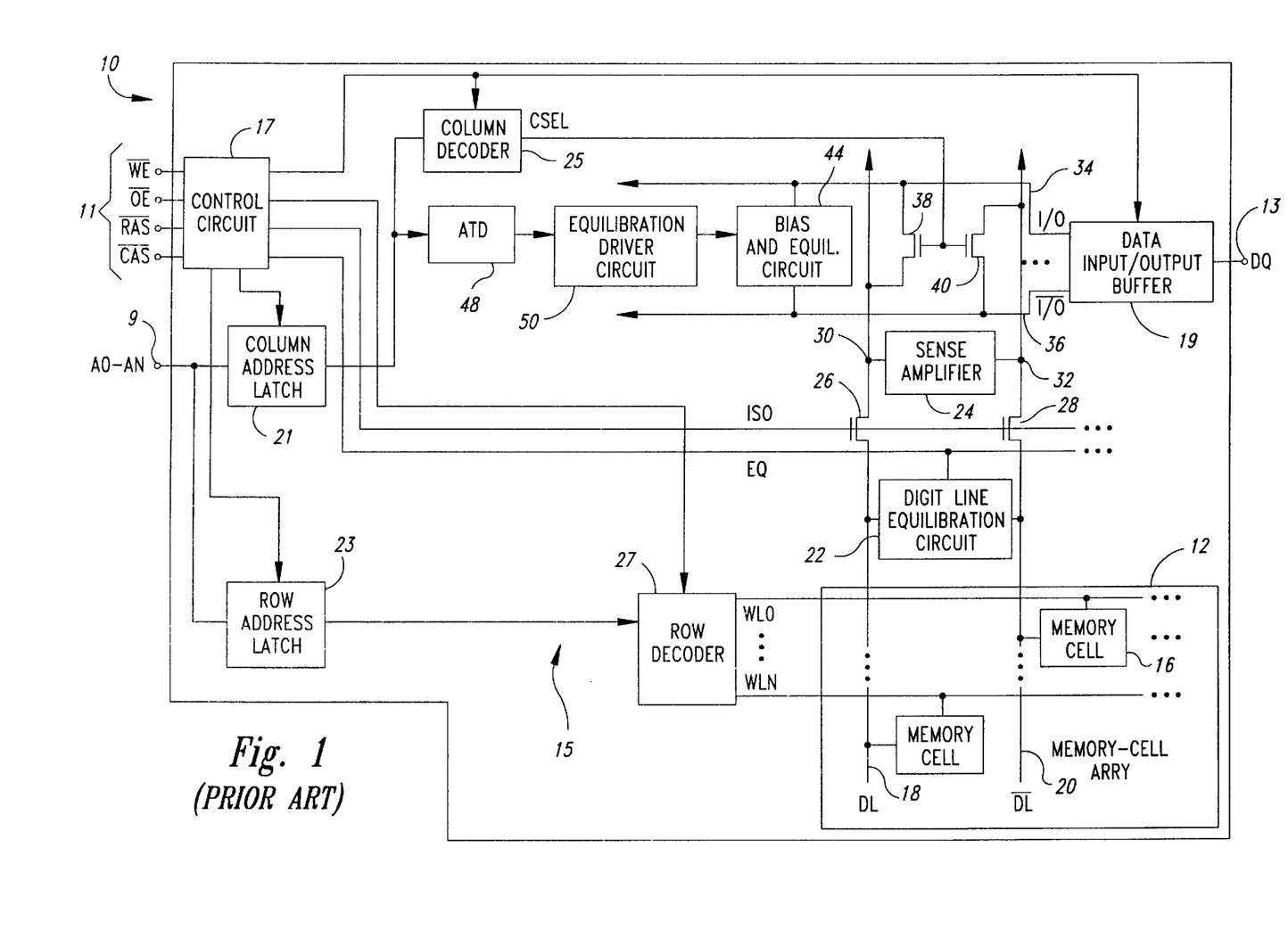
FIG. 1 is a block diagram of a conventional DRAM.

FIG. 1 is a schematic and block diagram of a conventional DRAM 10 which includes an address bus 9, a control bus 11, and a data bus 13 coupled, respectively, to address circuitry 15, a control circuit 17, and a data input/output buffer 19. The address circuitry 15 includes column and row address latches 21 and 23 which operate to latch column and row addresses, respectively, provided on the address bus 9. The column and row addresses latched by the latches 21 and 23 are output to respective column and row decoders 25 and 27 which decode the respective column and row addresses. The decoded column addresses from the decoder 25 are output in the form of column select signals, one of which, CSEL, is shown in FIG. 1. The decoded row addresses from the row decoder 27 are output in the form of word lines WLO-WLN.

The DRAM 10 includes a memory cell array 12 having a number of memory cells 16 arranged in rows and columns (only one column shown). Each memory cell 16 in a given row has a control terminal coupled to an associated word line WL and a data terminal coupled to one of an associated pair of true and complement digit lines 18 and 20. Each of the memory cells 16 stores binary data in the form of a voltage across a storage capacitor (not shown) with a voltage level of approximately $V_{cc}$ corresponding to a binary 1 and a voltage level of approximately 0 volts corresponding to a binary 0.

A digit line equilibration circuit 22 is coupled between each pair of true and complement digit lines 18 and 20 and receives an equilibration signal EQ on a control terminal. The equilibration circuits 22 operate to precharge the digit lines 18 and 20 to a predetermined voltage, typically $V_{cc}/2$, and to equalize the voltage on each digit line. Each pair of true and complement digit lines 18 and 20 is coupled to a sense amplifier 24 through a pair of isolation transistors 26 and 28. Specifically, the sense amplifier 24 has a true digit line 30 coupled to the true digit line 18 through the isolation transistor 26, and a complement digit line 32 coupled to the complement digit line 20 through the isolation transistor 28. The sense amplifier 24 operates to sense a voltage differential between the true and complement digit lines 30 and 32 and to drive the higher digit line to approximately $V_{cc}$ and the lower digit line to approximately 0 volts.

The digit lines 30 and 32 of the sense amplifier 24 are coupled to a pair of I/O lines 34 and 36 which carry data on the digit lines 30 and 32 to and from the data input/output buffer 19. Specifically, the true digit line 30 is coupled through an I/O transistor 38 to the true I/O line 34 and the complement digit line 32 is coupled through an I/O transistor 40 to the complement I/O line 36. The gate terminal of each of the I/O transistors 38 and 40 is coupled to the output of the column decoder 25 so that when the signal CSEL is active the I/O transistors turn ON.

The DRAM 10 further includes a bias and equilibration circuit 44 coupled between the true and complement I/O lines 34 and 36 which operates, when activated, to bias the I/O lines at a predetermined voltage, typically $V_{cc}$, and to equalize the voltage on the I/O lines. The bias and equilibration circuit 44 is enabled and disabled by an equilibration driver circuit 50 in response to transition detection pulse signals received from an address transition detector 48. The address transition detector 48 has input terminals coupled to receive the column address signals on the output terminals of the column address latch 21 and operates to develop the transition detection pulse signals when one or more of the column address signals transitions from one logic level to the complementary logic level.

In operation of the DRAM 10, before data is read from the memory-cell array 12, an equilibration cycle is executed. During an equilibration cycle, the control circuit 17 controls the decoder 27 to drive the word lines WL low so that each of the memory cells 16 is isolated from the associated digit lines 18 and 20. The control circuit 17 also drives the isolation line ISO high to thereby turn ON the isolation transistors 26 and 28 to couple the digit lines 18 and 20 of the memory cell array 12 to the digit lines 30 and 32, respectively, of the sense amplifier 24. The control circuit 17 then drives the equilibration line EQ high to activate the equilibration circuits 22 to thereby equalize the voltage on the digit lines 18 and 20 to approximately $V_{CC}/2$. Note that since the isolation transistors 26 and 28 are turned ON, the digit lines 30 and 32 of the sense amplifier 24 are likewise equalized to the voltage of approximately $V_{cc}/2$.

The equilibration interval is typically terminated when external circuitry (not shown) drives a row address strobe signal $\overline{RAS}$ on the control bus 11 low, thereby indicating the beginning of a data transfer cycle. When the row address strobe signal $\overline{RAS}$ goes low, row address signals provided on address pins AO–AN of the DRAM 10 are latched by the row address latch 23 and output to the row decoder 27 which decodes the row address and drives the word line WL of the addressed memory cell 16 high to activate each memory cell coupled to the activated word line. Each memory cell 16 coupled to the activated word line WL transfers the data stored in that cell to the associated digit line and thereby causes the voltage on the associated digit line to either increase or decrease from the equilibration voltage of $V_{cc}/2$. The sense amplifiers 24 then compare the voltage on the digit line coupled to the activated memory cell 16 to the voltage of $V_{cc}/2$ on the other digit line. In response to the sensed voltage differential between the digit lines, each sense amplifier 24 drives the higher digit line to $V_{cc}$ and drives the lower digit line to approximately 0 volts. The voltage levels on the digit lines 30 and 32 coupled to the activated memory cells 16 now represent the binary value of the data stored in the activated memory cells.

While the sense amplifiers 24 are sensing the data stored in the addressed memory cell 16, the external circuitry provides a column address on the bus 9 and drives a column address strobe signal $\overline{CAS}$ low to cause the column address latch 21 to latch the column address and output it to the column decoder 25. When the address transition detection circuit 48 detects a transition of one of the column address signals output by the latch 21, the address transition detection circuit outputs a transition detection pulse signal to the equilibration driver circuit 50. In response to receiving the transition detection pulse signal, the equilibration driver circuit 50 activates the bias and equilibration circuit 44 to bias the I/0 lines 34 and 36 at the predetermined voltage, typically $V_{cc}/2$, and equalize the voltage levels on the I/O lines. Once the I/O lines 34 and 36 have been biased and equilibrated, the column address decoder 25 outputs the column select signal CSEL to activate the I/0 transistors 38 and 40 of the addressed column of memory cells 16 to thereby couple the data on the digit lines 30 and 32 to the I/O lines 34 and 36, respectively. The I/O lines 34 and 36 carry this data to the input/output buffer 19 which provides the data on the data bus 13 of the DRAM 10 for use by external circuitry. In a conventional write data transfer operation, data on the data bus 13 is applied to the I/0 lines 34, 36 by the input/output buffer 19. After a column address has been latched and decoded as described above, the I/O lines 34, 36 are coupled to the digit lines 30, 32 corresponding to the column address. The isolation transistors 26, 28 are then turned ON to couple the digit lines 30, 32 to the digit lines 18, 20, respectively. A voltage corresponding to the input data is then applied by one of the digit lines 18, 20 to the memory cell 16 of an enabled wordline WL.

Figure 2:
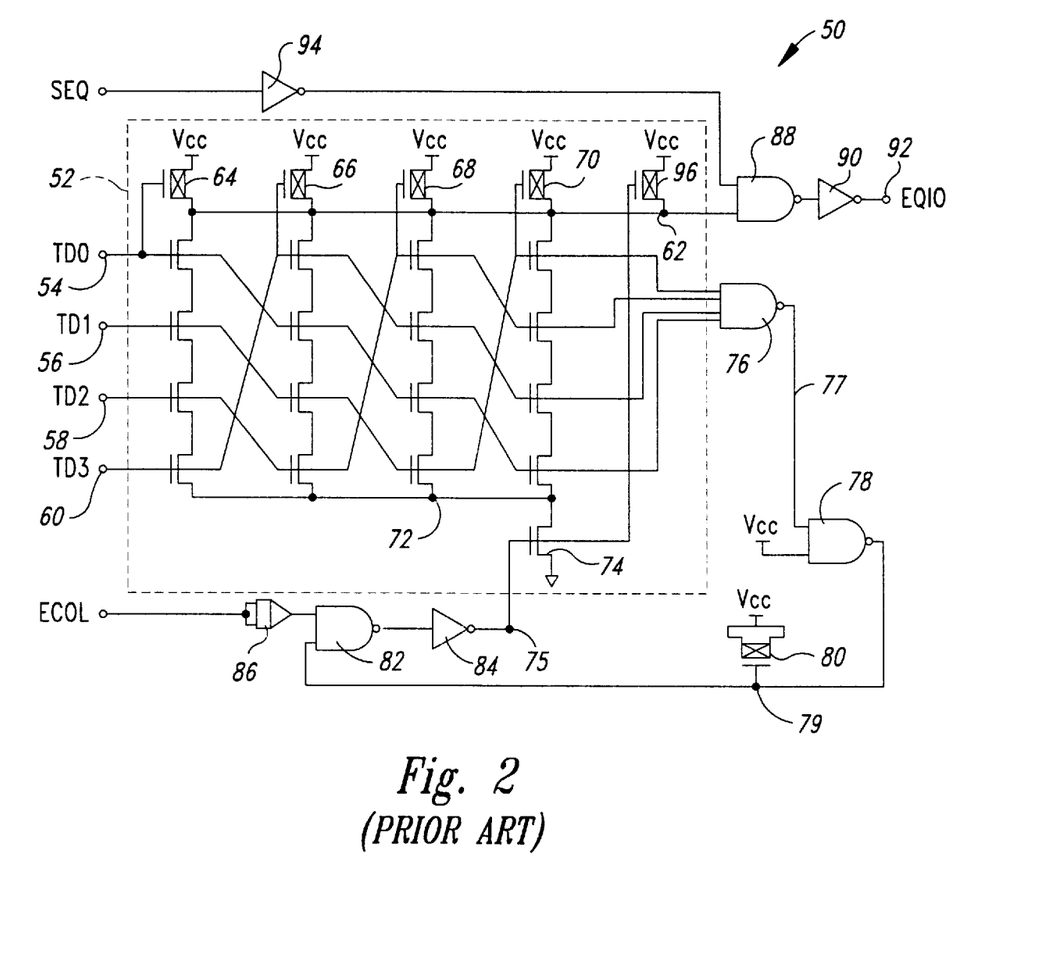
FIG. 2 is a schematic diagram of a conventional equilibration driver circuit as shown in FIG. 1.

FIG. 2 is a detailed schematic of the conventional equilibration driver circuit 50 of FIG. 1 including a balanced NAND gate 52 having four input terminals 54–60 which receive respective transition detection pulse signals TD0–TD3 from the address transition detector 48 of FIG. 1. The NAND gate 52 includes a plurality of PMOS transistors 64–70 coupled between a node 62 and a supply voltage $V_{cc}$ as shown, each having its gate terminal coupled to one of the input terminals 54–60. When activated, each of the PMOS transistors 64–70 couples the node 62 to the supply voltage $V_{cc}$. The balanced NAND gate 52 further includes a plurality of NMOS transistors coupled between the node 62 and a node 72 as shown, each of the NMOS transistors having its gate terminal coupled to one of the input terminals 54–60. Each group of four NMOS transistors coupled between the node 62 and the node 72 operates to couple the node 62 to the node 72 when each of the transistors in that group is activated. As understood by one skilled in the art, the balanced structure of the NAND gate 52 ensures that the input impedances at the inputs TD0–TD3 are the same and thereby ensures the relatively narrow pulse signals TD0–TD3 propagate through the circuit at the same rate. An NMOS transistor 74 has its source and drain terminals coupled between the node 72 and ground, and operates to couple the node 72 to ground when activated.

Each of the input terminals 54–60 of the balanced NAND gate 52 is further connected to a respective input of a NAND gate 76. The NAND gate 76 in conjunction with a NAND gate 78, a capacitor 80, a NAND gate 82, and an inverter 84 form a feedback loop which operates to deactivate the equilibrate signal EQIO a predetermined time after the termination of a transition detection pulse signal received on one of the input terminals 54–60 as will be explained in more detail below. An enable column signal ECOL, which is developed by other circuitry on the DRAM 10, is coupled through a delay circuit 86 to an input of the NAND gate 82. The delay circuit 86 operates to pass after a predetermined delay time a positive edge transition (i.e., from a low logic level to a high logic level) of the signal ECOL to pass without delay a negative edge transition (i.e., from a high logic level to a low logic level) of the signal ECOL. When the signal ECOL is low, the output of the delay circuit 86 is low, so the output of the NAND gate 82 is high which causes the inverter 84 to drive its output signal on a node 75 low to thereby turn OFF the transistor 74 and turn ON a transistor 96 which couples the node 62 to the supply voltage $V_{CC}$.

The node 62 of the balanced NAND gate 52 is connected to one input of a NAND gate 88 and a stop equilibration signal SEQ is coupled through an inverter 94 to a second input of the NAND gate 88. The output of the NAND gate 88 is connected to an input of an inverter 90 which outputs the equilibrate signal EQIO on a terminal 92. When the stop equilibrate signal SEQ is low, the output of the inverter 94 is high and the logic level of the signal on the node 62 determines the state of the output of the NAND gate 88, which in turn determines whether the signal EQIO is active. When the signal SEQ is high, the output of the inverter 94 is low, forcing the output of the NAND gate 88 high, which in turn forces the equilibrate signal EQIO to go low or inactive. The function of the stop equilibrate signal SEQ is to shorten the length of an equilibration cycle during a write operation.

Figure 3:
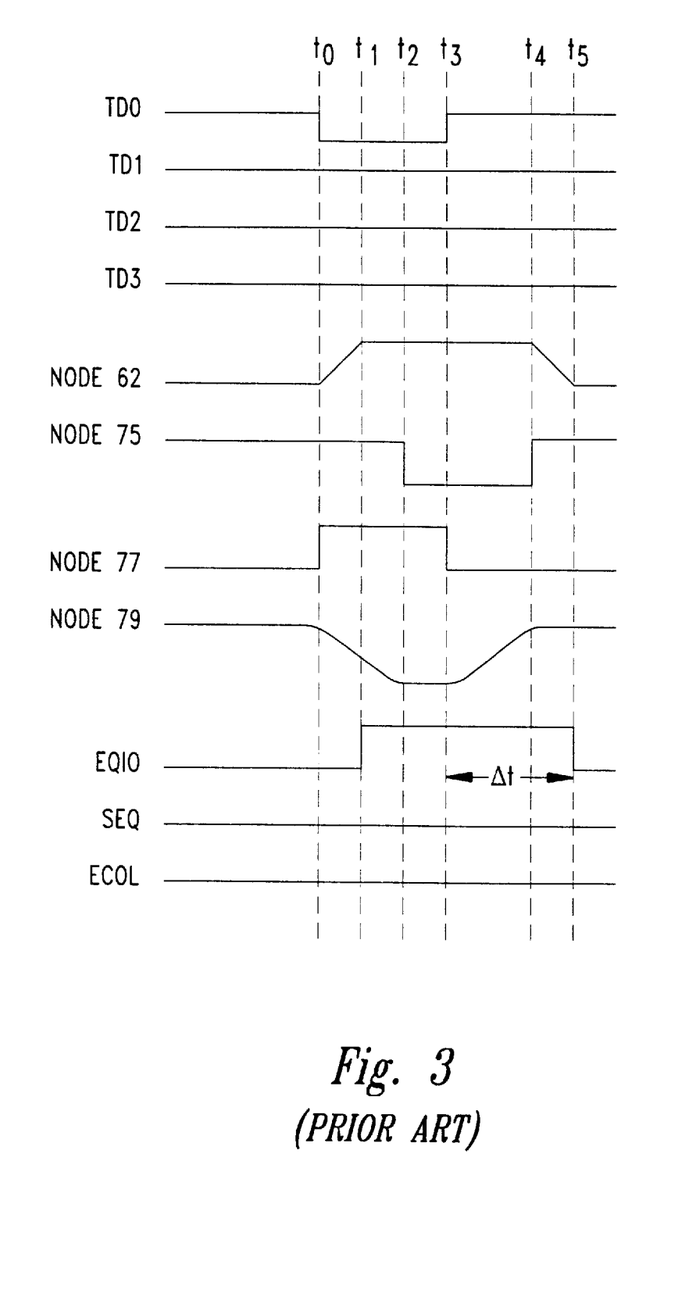
FIG. 3 is a timing diagram illustrating signals on various nodes of the equilibration driver circuit of FIG. 2.

In operation, the equilibration driver circuit 50 drives the equilibration signal EQIO on terminal 92 high for a predetermined time in response to a column address transition, as will now be described in greater detail with reference to the signal timing diagram of FIG. 3. Before a time $t_o$, the equilibration driver circuit 50 operates in a standby mode in which the circuit is waiting for a column address transition to occur. In the standby mode, each of the transition detection pulse signals TD0–TD3 is high, the stop equilibrate signal SEQ is low, and the enable column signal ECOL is high. Since each of the transition detection pulse signals TD0–TD3 is high, the output of the NAND gate 76 on a node 77 is low, which causes the output of the NAND gate 78 on a node 79 to be high. With the signal on the node 79 high and the enable column signal ECOL high, the output of the NAND gate 82 is low which causes the inverter 84 to drive its output signal on a node 75 high, which thereby turns ON transistor 74 and turns OFF transistor 96. Since each of the transition detection signals TD0–TD3 is high in the standby mode, the node 62 is coupled to the node 72 through the NMOS transistors and to ground through the transistor 74.

At time $t_0$, a column address transition is detected which causes the transition detection signal TD0 to go low. In response to the transition detection signal TD0 going low, the PMOS transistor 64 turns ON and begins to drive the signal on node 62 high. The signal timing diagram illustrates that the signal on node 62 is not driven instantaneously high by the PMOS transistor 64, but instead the voltage at node 62 gradually rises due to the relatively large capacitance at node 62. The capacitance of node 62 is high due in large part to the coupling of the balanced NAND gate 52 to the node 62. Each of the plurality of transistors comprising the balanced NAND gate 52 adds capacitance to the node 62. The transition detection signal TD0 going low at time $t_0$ also causes the NAND gate 76 to drive the signal on node 77 high. When the signal on node 77 goes high, the output of the NAND gate 78 goes low which begins to drive the signal on node 79 low. Due to the capacitor 80, however, the signal on node 79 is not driven instantaneously low, but instead decreases gradually over time. The amount of time it takes for signal on node 79 to go low is determined by the value of the capacitor 80 and is selected to achieve the desired operating characteristics of the equilibration driver circuit 50.

The voltage at node 62 increases gradually due to the capacitance at the node and is shown as finally going high at a time $t_1$. When the node 62 finally goes high at time $t_1$, the output of the NAND gate 88 goes low, which causes the inverter 90 to drive the equilibration signal EQIO on its output high to thereby cause the bias and equilibration circuit 44 (see FIG. 1) to bias and equilibrate a pair of complementary I/O lines. Also at time $t_1$, notice that the voltage at node 79 is continuing to fall but has not yet gone low due to the relatively slow rate of change of the voltage across the capacitor 80. At a time $t_2$, the voltage at node 79 finally goes low, and in response, the NAND gate 82 drives its output high which causes the inverter 84 to drive its output signal on the node 75 low, which thereby turns OFF transistor 74 and turns ON transistor 96. At this point, the transistor 74 isolates the node 72 from ground and the node 62 is held high by the PMOS transistors 64 and 96.

The transition detection signal TD0 goes high at a time $t_3$ which causes the PMOS transistor 64 to turn OFF and causes the output of the NAND gate 76 to drive the signal on node 77 low. In response to the voltage on node 77 going low, the output of the NAND gate 78 goes high which begins to drive the signal on node 79 high. As previously described, however, the voltage on node 79 will rise gradually due to the capacitor 80 and thus the voltage on node 79 does not instantaneously go high. As a result of the gradual rise of the voltage on node 79, the NAND gate 82 maintains its output high which means that the inverter 84 continues to drive the voltage at node 75 low, which keeps the transistor 74 turned OFF and the node 62 coupled to the supply voltage $V_{cc}$ through the transistor 96. Thus, even though the transition detection signal TD0 terminates by going high at time $t_3$, the voltage at node 62 is held high which causes the equilibration signal EQIO to remain high. The amount of time for which the equilibration signal EQIO remains high after the transition detection signal TD0 terminates is indicated by the time period $\Delta t$ indicated in FIG. 3, this time period being determined by the value of the capacitor 80.

At a time $t_4$, the voltage on node 79 has finally gone high which causes the NAND gate 82 to drive its output low and the inverter 84 to drive the voltage on node 75 high, which turns ON the transistor 74 and turns OFF the transistor 96. At this point, the node 62 is coupled to the node 72 through the NMOS transistors and to ground through the transistor 74, which causes the voltage on the node 62 to begin to fall. As previously described, the node 62 has a relatively large capacitance, and therefore the voltage at node 62 cannot instantaneously go low. At a time $t_5$, the voltage on node 62 finally goes low which causes the NAND gate 88 to drive its output high and the inverter 90 to drive the equilibration signal EQIO low to terminate the active equilibration signal from the equilibration driver circuit 50. When more than one transition detection signal TD0–TD3 is received by the equilibration driver circuit 50, the driver circuit operates substantially as previously described except that the equilibration signal EQIO terminates a time $\Delta t$ after the termination of the last transition detection signal received.

From this description of the conventional equilibration driver circuit 50, it is seen that the capacitance of the node 62 slows the response time of the circuit. This is true because, as indicated between the times $t_0$–$t_1$, and times $t_4$–$t_5$, the voltage at node 62 cannot rise instantaneously but must instead rise and fall gradually over time. Ideally, the equilibration signal EQIO would terminate at the time $t_4$ when the voltage on node 75 goes high. Due to the relatively large capacitance of the node 62, however, the equilibration signal EQIO does not terminate until the time $t_5$. Operation of the equilibration driver circuit 50 is thus slowed by the capacitive time delay of the node 62 and results in a longer cycle of operation of the equilibration driver circuit.

Although the foregoing discussion deals with equilibrating I/O lines in a DRAM, a similar problem exists in equilibrating the I/O lines of a static random access memory ("SRAM") and other memory devices. Thus, much of the foregoing is applicable to memory devices other than DRAMs.

Thus, there is a need for an equilibration driver circuit that minimizes capacitive effects to allow faster operation than conventional circuits and which also occupies less space on the DRAM in which it is integrated.

SUMMARY OF THE INVENTION

An equilibration driver circuit provides an equilibration signal on a node in a memory device, the node being coupled to an equilibration circuit in the memory device which equalizes voltage levels on complementary pairs of input/output lines in the memory device in response to the equilibration signal. The equilibration driver circuit comprises an address transition detection circuit having an input terminal adapted to receive a column address signal. The address transition detection circuit is operable to output a pulse signal having a predetermined duration in response to a transition of the column address signal from one logic level to the complementary logic level. A switching circuit has an input terminal receiving the pulse signal and an equilibration terminal coupled to the node. The switching circuit is operable in a first mode to couple the equilibration terminal to a first reference voltage in response to the pulse signal being active. The switching circuit is operable in a second mode to couple the equilibration terminal through a low impedance circuit to a second reference voltage subsequent to the first mode. In a third mode of operation, the switching circuit couples the equilibration terminal through a high impedance circuit to the second reference voltage subsequent to the second mode.

DETAILED DESCRIPTION OF THE INVENTION

Figure 4:
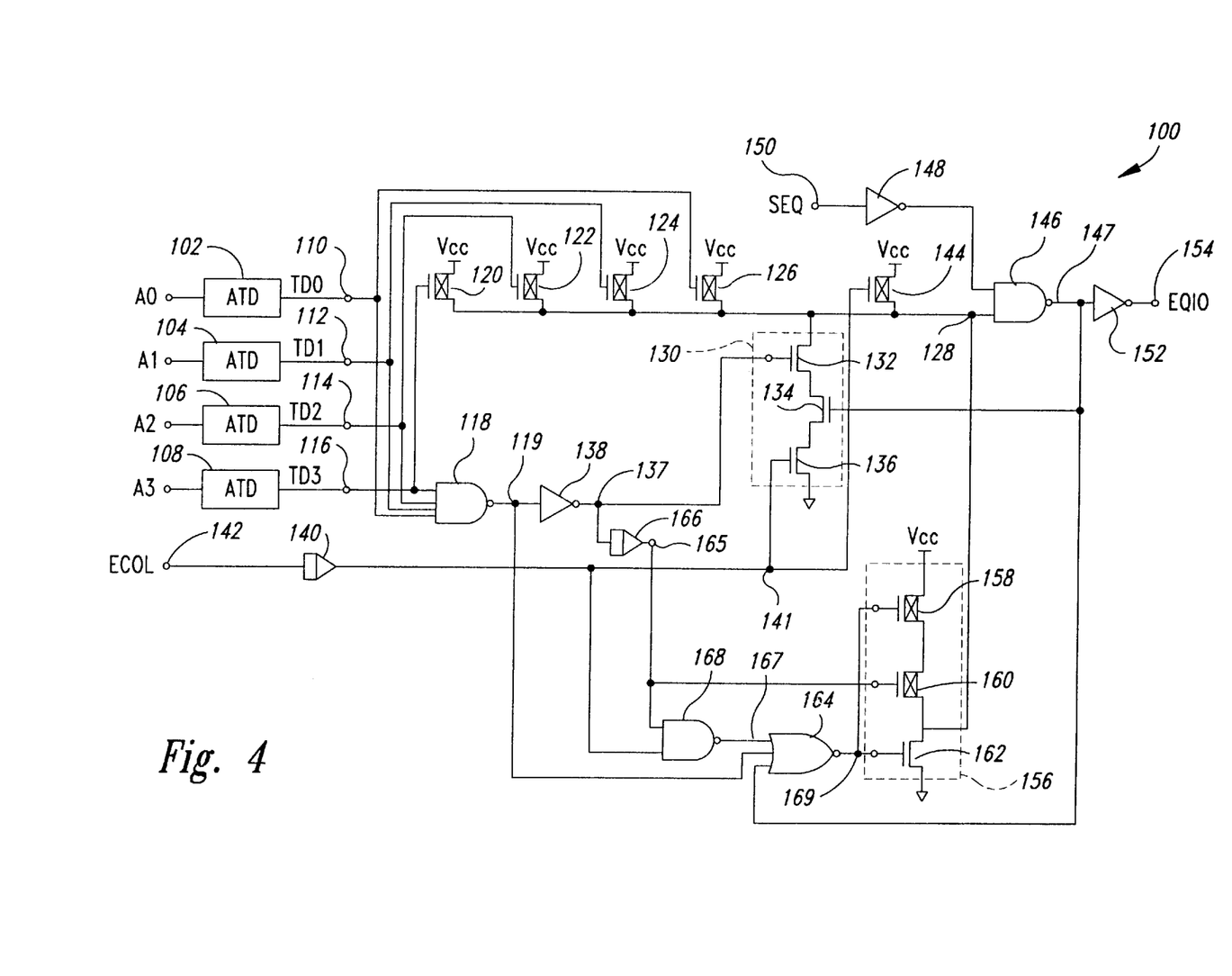
FIG. 4 is a schematic diagram of one embodiment of an equilibration driver circuit according to the present invention.

FIG. 4 illustrates one embodiment of an equilibration driver circuit 100 in accordance with the present invention. A plurality of address transition detectors 102–108 develop transition detection pulses TD0–TD3 on input terminals 110–116, respectively, of the equilibration driver circuit 100. As previously described, each address transition detector 102–108 has an input terminal coupled to receive a column address signal from a respective column address terminal A0–A3 and operates to develop the transition detection pulse on its output in response to the column address signal on its input going from one logic state to the complementary logic state. Such address transition detectors are conventional and not described in further detail. The input terminals 110–116 are coupled to respective inputs of a balanced NAND gate 118 which would typically comprise the configuration of PMOS and NMOS transistors as described with reference to the balanced NAND gate 52 of FIG. 2. Each of the transition detection signals TD0–TD3 is high when no transition of a column address signal is detected by the address transition detectors 102–108 and the output of the balanced NAND gate 118 on a node 119 is accordingly low.

The equilibration driver circuit 100 further includes four PMOS transistors 120–126, each transistor having a gate terminal coupled to a respective input terminal 110–116. Each of the PMOS transistors 120–126 has its source terminal connected to a supply voltage $V_{cc}$ and its drain terminal coupled to a node 128 and operates, when activated, to couple the node 128 to the supply voltage. When the transition detection signals TD0–TD3 are high, all of the PMOS transistors 120–126 are OFF to thereby isolate the node 128 from the supply voltage $V_{cc}$. When any of the transition detection signals TD0–TD3 goes low, the PMOS transistor 120–126 coupled to the associated input terminal turns ON to thereby couple the node 128 to the supply voltage $V_{cc}$. For example, if the address transition detector 102 detects a column address signal transition on the terminal A0, the address transition detector generates the transition detection pulse signal TD0 which drives the gate of the PMOS transistor 126 low for the duration of the pulse signal to thereby couple the node 128 to the supply voltage $V_{CC}$.

The equilibration driver circuit 100 further includes a high impedance switch circuit 130 coupled between the node 128 and ground. In one embodiment, the high impedance switch circuit 130 comprises three NMOS transistors 132–136 having their source and drain terminals coupled in series between the node 128 and ground as shown. Each of the NMOS transistors 132–136 is configured such that it has a relatively high channel impedance which means that when all of the NMOS transistors 132–136 are turned ON, the node 128 is coupled to ground through a high impedance path. The reason for sizing the NMOS transistors 132–136 so that they provide a high impedance path between the node 128 and ground will be explained in more detail below.

The gate of the NMOS transistor 132 is connected to a node 137 which is in turn connected to the output of the balanced NAND gate 118 through an inverter 138. As previously described, when all transition detection pulse signals TD0–TD3 are high, the output of the balanced NAND gate 118 is low, which means that the output of the inverter 138 is high and the NMOS transistor 132 is turned ON. Conversely, if any of the transition detection pulse signals TD0–TD3 goes low, the output of the balanced NAND gate 118 goes high and the output of the inverter 138 goes low to thereby turn OFF the transistor 132. A positive edge delay circuit 140 has its input connected to a terminal 142 which receives the enable column signal ECOL and its output connected to a node 141 which is in turn connected to the gate terminal of the transistor 136. The positive edge delay circuit 140 operates to delay for a predetermined time a positive edge transition of the enable column signal ECOL and to pass without delay a negative edge transition of the enable column signal ECOL. Thus, when the enable column signal ECOL goes from low to high, the output of the positive edge delay circuit 140 does not go high until a predetermined time after this transition, and when the enable column signal ECOL goes from high to low, the output of the positive edge delay circuit immediately goes low. When the output of the positive edge delay circuit 140 is high, the transistor 136 is ON. A PMOS transistor 144 has its gate terminal connected to the output of the positive edge delay circuit 140 and its source and drain terminals coupled between the supply voltage $V_{cc}$ and the node 128 and operates, when activated, to couple the node 128 to the supply voltage $V_{CC}$ and otherwise to isolate the node 128 from the supply voltage.

The transistor 134 has its gate terminal connected to a node 147 which is in turn connected to an output of a NAND gate 146 such that, when the output of the NAND gate 146 is high, the transistor 134 is turned ON, and when the output is low, the transistor 134 is turned OFF. One input of the NAND gate 146 is coupled to the node 128 and a second input of the NAND gate is coupled to an output of an inverter 148 which has its input coupled to a terminal 150 which receives the stop equilibration signal SEQ. When the stop equilibration signal SEQ is low and the signal on node 128 is high, the output of the NAND gate 146 is low, which turns OFF the transistor 134, and when either the signal on node 128 is low or the stop equilibration signal SEQ is high, the output of the NAND gate 146 is high, which turns ON the transistor 134. An inverter 152 has an input coupled to the output of the NAND gate 146 and operates to invert the signal on its input and output the equilibrate signal EQIO on a terminal 154.

The equilibration driver circuit 100 further includes a low impedance switch circuit 156 comprising PMOS transistors 158 and 160, and an NMOS transistor 162 having their source and drain terminals coupled between the supply voltage $V_{cc}$ and ground as shown. In contrast to the transistors 132–136 of the high impedance switch circuit 130, the transistor 162 of the low impedance switch circuit 156 is configured to have a low channel impedance. The drain terminal of the transistor 162 is connected to the node 128 so that when the transistor 162 turns ON, the node 128 is coupled to ground through a low impedance path. The gate terminal of the transistor 162 is connected to a node 169 which is in turn connected to an output terminal of a NOR gate 164, and is further connected to the gate terminal of the transistor 158. When the output of the NOR gate 164 is high, the transistor 162 is turned ON and the transistor 158 is turned OFF and, conversely, a low output from the NOR gate turns OFF transistor 162 and turns ON transistor 158. The gate terminal of the transistor 160 is connected to a node 165 which is in turn connected to an output of a positive edge delay circuit 166 having its input connected to the output of the inverter 138 and which operates the same as the previously described positive edge delay circuit 140. In operation, the low impedance switch circuit 156 operates to couple the node 128 to ground through the transistor 162 when the output of the NOR gate 164 is high, and to couple the node 128 to the supply voltage $V_{cc}$ when the output of the NOR gate 164 is low and the output of the positive edge delay circuit 166 is also low.

A NAND gate 168 has its inputs coupled to the outputs of the positive edge delay circuits 140 and 166, and its output connected to a node 167 which is in turn connected to one input of the NOR gate 164. The other two inputs of the NOR gate 164 are connected to the outputs of the balanced NAND gate 118 and NAND gate 146. The NAND gate 168 and NOR gate 164 combine to control the operation of the low impedance switch circuit 156 as will be described in greater detail below.

Figure 5:
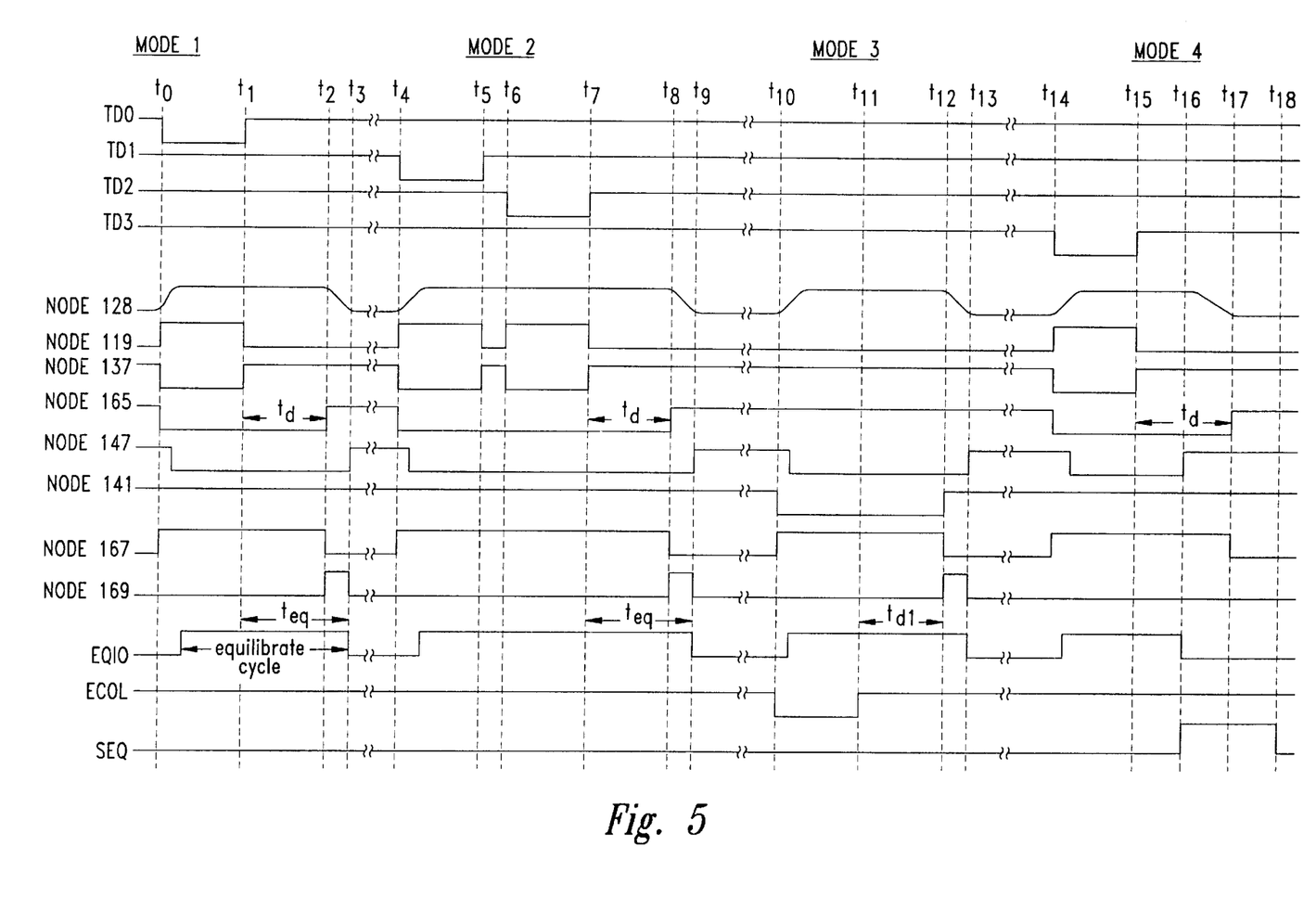
FIG. 5 is a timing diagram illustrating signals on various nodes of the equilibration driver circuit of FIG. 4.

The operation of the equilibration driver circuit 100 will now be described with reference to the signal timing diagram of FIG. 5. Four modes of operation of the equilibration driver circuit 100 are illustrated in FIG. 5. Mode 1 is characterized by a single column address signal transition which results in the single transition detection pulse signal TD0. In Mode 2, two column address signal transitions occur which cause the two transition detection pulse signals TD1 and TD2 and illustrate the operation of the equilibration driver circuit 100 when multiple column address signal transitions occur. Mode 3 is characterized by the enable column signal ECOL going low to force the equilibration driver circuit 100 to output the equilibrate signal EQIO. Finally, Mode 4 is characterized by the stop equilibrate signal SEQ going active to terminate the equilibrate signal EQIO such as would occur during a write data transfer operation.

During operation of the equilibration driver circuit 100 in Mode 1, before a time to, the transition detection pulse signals TD0–TD3, the signals on nodes 137, 141, 147, and 165, and the enable column signal ECOL are all high while all other signals are low. It should be noted that during this time the signals at the gate terminals of the transistors 132, 134, and 136 of the high impedance switch circuit 130 are all high which causes the node 128 to be coupled to ground through the high impedance path of the high impedance switch circuit 130. Also during this time, since the signal on node 147 is high, the signal on node 169 coupled to the output of the NOR gate 164 is low, which turns OFF the transistor 162 and thereby isolates the node 128 from ground through the low impedance path.

At time $t_0$, the column address signal on the terminal A0 transitions which causes the address transition detector 102 to drive the transition detection pulse signal TD0 low. When the transition detection pulse signal TD0 goes low, the signal at node 119 at the output of the balanced NAND gate 118 goes high, since one of the inputs to the balanced NAND gate is now low. When the signal on node 119 goes high, the inverter 138 drives the signal on node 137 low, to thereby turn OFF transistor 132, which isolates the node 128 from ground by opening the high impedance path to ground through the high impedance switch circuit 130. At the same time, the low transition detection pulse signal TD0 turns ON the transistor 126 to thereby couple the node 128 to the supply voltage $V_{cc}$. Although the capacitance at node 128 is substantially less than the capacitance at the node 62 of the prior art equilibration driver circuit 50, there is nonetheless a finite capacitance which results in the signal on node 128 going high gradually.

The high signal on node 128 causes the NAND gate 146 to drive its output signal on node 147 low because both inputs to this NAND gate are now high. In response to the signal on node 147 going low, the inverter 152 drives the equilibrate signal EQIO on node 154 high to start an equilibration cycle of the I/O lines of the DRAM.

Also occurring at time $t_o$, the output signal of the inverter 138 on node 137 going low causes the positive edge delay circuit 166 to drive its output signal on node 165 low without any delay, since the transition on node 137 is a negative edge transition. When the signal on node 165 goes low, the NAND gate 168 drives its output signal on node 167 high. Because the signal on node 119 is already high, the signal on node 167 going high does not affect the output signal of the NOR gate 164 on node 169, which remains low.

At time $t_1$, the transition detection pulse signal TD0 goes high, turning OFF the transistor 126 and thereby isolating the node 128 from the supply voltage $V_{cc}$ through this transistor. The node 128 remains coupled to the supply voltage $V_{cc}$, however, through the transistors 158 and 160 since the signals on nodes 165 and 169 are low which keeps both transistors 158 and 160 turned ON. Also occurring at time $t_1$, in response to the transition detection pulse signal TD0 going high, the balanced NAND gate 118 drives its output signal on node 119 low and the inverter 138 accordingly drives the signal on node 137 high. The high signal on node 137 turns ON the transistor 132, but since the signal on node 147 remains low, the transistor 134 remains OFF and the node 128 remains isolated from ground through the high impedance switch circuit 130. The positive edge transition of the signal on node 137 at time $t_1$, is delayed by the positive edge delay circuit 166, and thus the signal on node 165 remains low for a predetermined delay time $t_d$ which defines the interval between the time $t_1$, and a time $t_2$.

After the predetermined delay time $t_d$ has expired, at the time $t_2$, the positive edge delay circuit 166 drives the signal on node 165 high, which turns OFF the transistor 160 to isolate the node 128 from the supply voltage $V_{cc\ and}$ causes the NAND gate 168 to drive its output signal on node 167 low. At this point in time, the signals on nodes 147, 119, and 167, which are the input signals to the NOR gate 164, are all low, which causes the NOR gate to drive its output signal on node 169 high and thereby turn OFF the transistor 158 and turn ON transistor 162 to couple the node 128 to ground through the low impedance path. Due to the finite capacitance of the node 128, the signal on node 128 does not go low instantaneously, but instead decreases more gradually as indicated between the times $t_2$ and $t_3$. It should be noted, however, that the transition of the signal on node 128 between the times $t_2$ and $t_3$ is much faster than the transition of the node 62 in the prior art equilibration driver circuit 50 because of the much lower capacitance of the node 128 and the low impedance path presented by the transistor 162.

Once the signal on node 128 has gone low at time $t_3$, the signal on node 147 goes high, which causes the inverter 152 to drive the equilibrate signal EQIO low to thereby terminate the equilibration cycle. In addition, the signal on node 147 going high also turns ON the transistor 134 to thereby couple the node 128 to ground through the high impedance path of the high impedance switch circuit 130. Furthermore, the high signal on node 147 causes the NOR gate 164 to drive its output signal on node 169 low, which turns ON the transistor 158 and turns OFF the transistor 162 to thereby isolate the node 128 from ground through the low impedance path. However, the PMOS transistor 160 remains OFF to isolate the node 128 from $V_{cc}$. At this point in time, a complete equilibration cycle has occurred and the equilibration driver circuit 100 awaits the transition of a column address signal on one of the column address terminals A0–A3 to perform another equilibration cycle. Notice that the equilibration cycle terminates when the equilibrate signal EQIO goes high a predetermined time $t_{eq}$ after the rising edge or end of the transition detection pulse signal TD0.

The equilibration driver circuit 100 provides high speed switching of the equilibrate signal EQIO by driving the signal on node 128 high or low much faster than was possible with previous equilibration driver circuits. This high speed switching is due primarily to two factors. First, the balanced NAND gate 118 is not coupled to the node 128 which decreases the capacitance of node 128 and thereby allows the signal on the node to more rapidly transition between logic states. Second, the use of the high impedance switch circuit 130 provides a faster positive edge transition of the signal on node 118 than does a conventional equilibration driver circuit. For a positive edge transition, one of the transistors 120–126 is activated to drive the signal on node 128 high. The high impedance presented by circuit 130 allows the activated transistor 120–126 to quickly drive the signal on node 118 high since the circuit 130 draws only a small current from the current being sourced by the activated transistor. Thus, the net current flowing to charge the capacitive node 128 is higher than if a low impedance circuit were drawing current from node 128 while the activated transistor 120–126 was attempting to charge the node. A rapid low going transition of the signal on node 128 is provided by the low impedance switch circuit 156 which rapidly drains charge from the node to drive the signal on node 128 low.

The operation of the equilibration driver circuit 100 in Mode 2 is substantially the same as that previously described in Mode 1, except that the equilibration signal EQIO does not terminate until the predetermined time $t_{eq}$ after the rising edge of the final transition detection pulse signal TD2 at a time $t_7$. During Mode 2, an initial column address signal transition on terminal A1 occurs at time $t_4$, causing the address transition detector 104 to drive the transition detection pulse signal TD1 low at time $t_4$. As previously described, this causes the signal on node 128 to go high, which results in the equilibrate signal EQIO going high to start the equilibrate cycle. At time $t_5$, the transition detection pulse signal TD1 goes high, which starts the delay time $t_d$ of the positive edge delay circuit 166 running due to the positive edge transition of the signal on node 137. Before the delay time $t_d$ interval expires, however, a second column address signal transition on the terminal A2 is detected by the address transition detector 106, which accordingly drives the transition detection pulse signal TD2 low at time $t_6$. As a result, the signal on node 137 goes low and the delay time $t_d$ interval of the positive edge delay circuit 166 is terminated, which allows the signal on node 128 to remain high.

At time $t_7$, the transition detection pulse signal TD2 goes high which, as previously described, results in the signal on node 137 going high and starts the timing of the delay time $t_d$ by the positive edge delay circuit 166. The positive going transition of the pulse signal TD2 at time $t_7$ is analogous to that of the pulse signal TDO at time $t_1$, in Mode 1 operation and the operation of the equilibration driver circuit 100 after time $t_7$ in Mode 2 is identical to that in Mode 1 after time $t_1$. Note that the equilibrate signal EQIO goes low at time $t_9$ to terminate the equilibrate cycle and that this occurs precisely after the interval $t_{eq}$ from the final positive edge transition of the final pulse signal TD2 at time $t_7$. Thus, when the transition of column address signals is skewed, which results in skewed transition detection pulse signals (TD1 and TD2 in Mode 2), the equilibration cycle terminates a predetermined time $t_{eq}$ after the positive edge transition of the final skewed pulse signal.

Operation of the equilibration driver circuit 100 in Mode 3 is characterized by the enable column signal ECOL going low at time $t_{10}$ such as would occur when the column address decoders are disabled as will be described in more detail later. Before time $t_{10}$, the state of the equilibration driver circuit 100 is the same as that in Mode 1 before time to so that the node 128 is coupled to ground through the high impedance switch circuit 130. When the enable column signal ECOL goes low, the positive edge delay circuit 140 immediately drives its output signal low which turns OFF transistor 136 and thereby isolates the node 128 from ground through the high impedance path of the switch circuit 130 and also turns ON the transistor 144 which couples the node 128 to the supply voltage $V_{CC}$ through the transistor 144.

Accordingly, the signal on node 128 goes high which causes the NAND gate 146 to drive the signal on node 147 low which causes the inverter 152 to drive the equilibrate signal EQIO high. As long as the enable column signal ECOL is low, the transistor 144 remains ON and the equilibrate signal EQIO remains high. Notice that at time $t_{10}$ the low signal on node 147 ensures that the transistor 134 is turned OFF to isolate the node 128 from ground through the high impedance path of the switch circuit 130 and also ensures that the NOR gate 164 drives its output signal on node 169 low to thereby turn OFF the transistor 162 and isolate the node 128 from ground through the low impedance path of the switch circuit 156.

At time $t_{11}$, the enable column signal ECOL goes high and as previously described the positive edge delay circuit 140 drives its output signal on node 141 high a predetermined delay time $t_{d1}$ after the positive edge of the enable column signal ECOL. The signal on node 141 goes high at time $t_{12}$ which turns ON the transistor 136 and turns OFF the transistor 144 to isolate the node 128 from the supply voltage $V_{CC}$. The signal on node 141 going high also causes the NAND gate 168 to drive its output signal on node 167 low causing the NOR gate 164 to drive its output signal on node 169 high and thereby turn ON the transistor 162 which couples the node 128 to ground through the low impedance path. Once the signal on node 128 is driven low through the transistor 162, which occurs at time $t_{13}$, the signal on node 147 goes high which causes the inverter 152 to drive the equilibrate signal EQIO low and thereby terminate the equilibrate cycle. The signal on node 147 going high also causes the NOR gate 164 to drive its output signal on node 169 low which thereby turns OFF the transistor 162 and isolates the node 128 from ground through the low impedance path. At this point, the node 128 is coupled to ground through the high impedance path of the high impedance switch circuit 130 as previously described.

Operation of the equilibration driver circuit 100 in Mode 4 is characterized by the stop equilibrate signal SEQ going high to terminate an equilibrate cycle early such as would occur during a write data transfer operation. Once again, before a time $t_{14}$ the equilibration driver circuit 100 couples the node 128 to ground through the high impedance switch circuit 130. At time $t_{14}$, a column address signal transition occurs on terminal A3 and the address transition detector 108 accordingly drives the pulse signal TD3 low. The pulse signal TD3 goes high at time $t_{15}$ and operation of the equilibration driver circuit 100 is identical to that described in Mode 1 between the time $t_0$ and $t_1$ up to this point in time. During Mode 4 operation, however, before the delay time interval $t_d$ elapses at time $t_{17}$, the stop equilibrate signal SEQ goes high at time $t_{16}$. When the stop equilibrate signal SEQ goes high the inverter 148 drives its output signal low which causes the NAND gate 146 to drive the signal on node 147 high and the inverter 152 to drive the equilibrate signal EQIO low which thereby terminates the equilibrate cycle. Thus, as soon as the stop equilibrate signal SEQ goes high the equilibrate cycle is terminated. Note that at time $t_{16}$, the signal on node 147 goes high which turns ON the transistor 134 and since the signal on node 137 is already high, turning on transistor 132, the node 128 is coupled to ground through the high impedance path of the switch circuit 130. Once the signal on node 128 has gone low, the stop equilibrate signal SEQ goes low at time $t_{18}$ and at this point the equilibration driver circuit 100 is ready for the next equilibration cycle.

Figure 6:
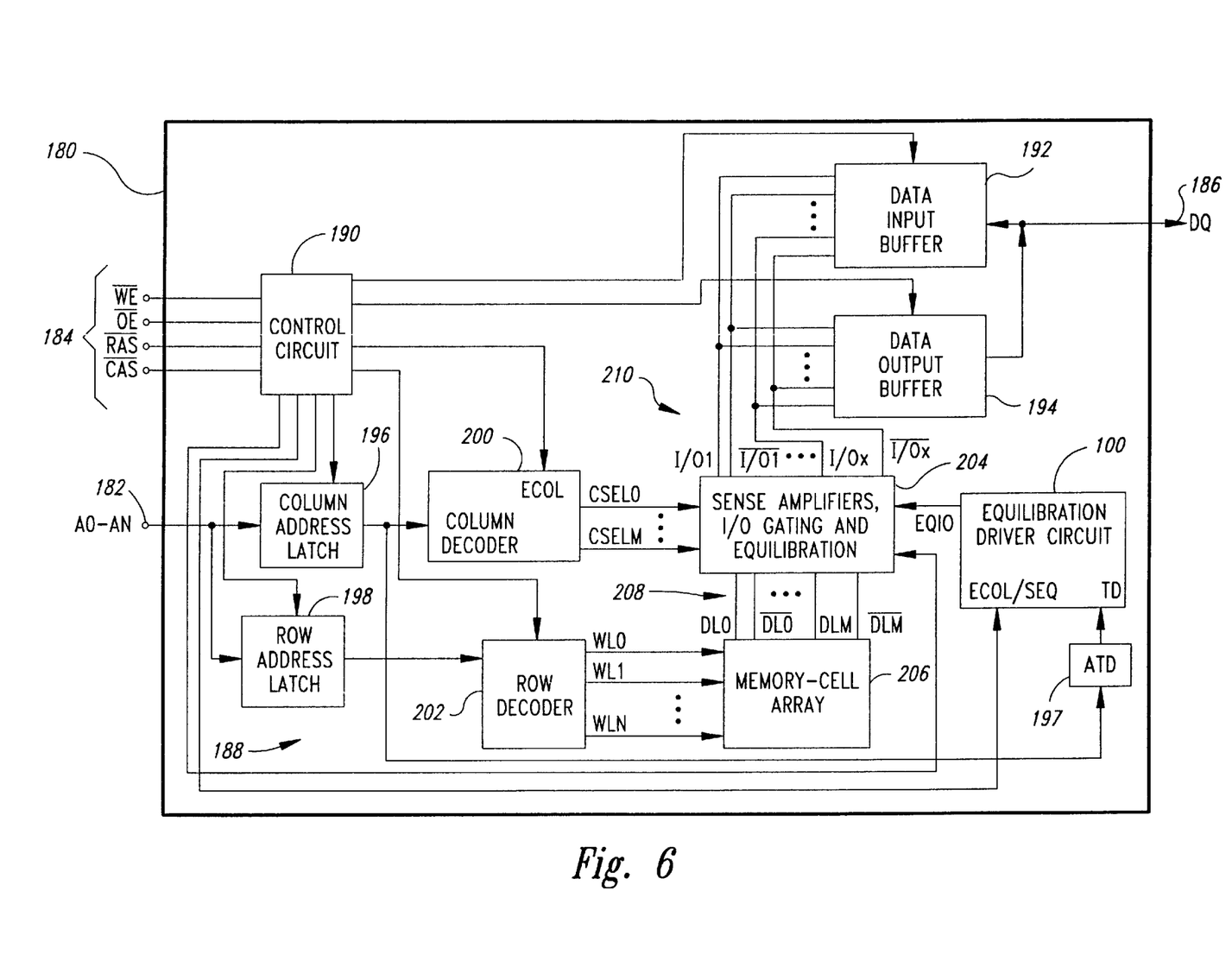
FIG. 6 is a schematic block diagram of a DRAM which includes the equilibration driver circuit of FIG. 4.

FIG. 6 is a block diagram of a DRAM 180 which includes the equilibration driver circuit 100 according to the present invention. The DRAM 180 includes an address bus 182, a control bus 184, and a data bus 186, coupled, respectively, to address circuitry 188, a control circuit 190, and data input and output buffers 192 and 194. The address circuitry 188 includes column and row address latches 196 and 198 which operate to latch column and row addresses, respectively, provided on the address bus 182. The column and row addresses latched by the latches 196 and 198 are output to respective column and row decoders 200 and 202 which operate to decode the respective column and row addresses. The output of the column address latch 196 is further connected to an address transition detector 197 which outputs pulse signals to the equilibration drive circuit 100 when transition of a column address signal occurs. The decoded column address from the decoder 200 is provided in the form of a column select signal CSEL to a sense amplifier, I/O gating, and equilibration circuit 204, and the decoded row address from the row decoder 202 is provided in the form of a word line WL to a memory cell array 206. The memory cell array 206 is coupled to the circuit 204 through a plurality of complementary digit lines 208 and the circuit 204 operates to equilibrate the digit lines 208, sense data provided by addressed memory cells on the digit lines 208, couple the digit lines 208 associated with addressed memory cells to respective I/O lines 210, and to equilibrate the I/O lines under control of the equilibration driver circuit 100. During a write data transfer operation, data on the data bus 186 are coupled through the data input buffer 192 to the I/O lines 210 and during a read operation data on the I/O lines 210 are coupled through the data output buffer 194 to the data bus 186.

In operation, external circuitry provides address, control, and data signals on the respective buses 182, 184, and 186 to the DRAM 180. During a read operation, the external circuitry drives the control signal write enable $\overline{WE}$ high and the control signal output enable $\overline{OE}$ low to thereby place the data input buffer 192 in a low impedance state and to couple the data bus 186 through the data output buffer 194 to the I/O lines 210. The external circuitry then provides a row address on the address bus 182 and drives the row address strobe $\overline{RAS}$ low to latch that row address into the row address latch 198 under control of the control circuit 190. The row address latch 198 outputs the latched row address to the row decoder 202 which decodes the row address and activates the word line WL of the addressed memory cell in the memory cell array 206. It should be noted that when the row address strobe signal $\overline{RAS}$ goes low, the circuit 204 typically terminates equilibration of the digit lines 208 in anticipation of the addressed memory cells in the memory cell array 206 being coupled to their associated digit lines 208 and the sense amplifiers in circuit 204 sensing the data stored in those addressed cells.

While the row address is propagating through the row address latch 198 and row decoder 202, the external circuitry provides a column address on the address bus 182 and drives a column address strobe $\overline{CAS}$ low to thereby latch the column address into the column address latch 196 under control of the control circuit 190. The column address latch 196 outputs the column address to the column decoder 200, but the column decoder typically does not begin decoding the column address until the word line WL of the addressed memory cells is activated. Typically, when the word line WL of the addressed memory cells is activated the enable column signal ECOL is output by the control circuit 190 to the column decoder 200 to thereby enable the column decoder to begin decoding the column address, and the signal ECOL is also output to the equilibration driver circuit 100. When the column address latch 196 outputs the latched column address, the ATD 197 outputs a pulse signal to the equilibration driver circuit 100 which in turn outputs the equilibrate signal EQIO to the circuit 204 to cause equilibration of the I/O lines 210. The column decoder 200 proceeds to decode the column address and activates the column select signal CSEL of the columns containing the addressed memory cells. When the column select signal CSEL is activated, the data of the addressed memory cells on the digit lines 208 and stored in the sense amplifiers of the circuit 204 are output to the I/O lines 210, and from the I/O lines 210 through the data output buffer 194 to the data bus 186 where it is read by the external circuitry.

During a write operation, the external circuitry drives the control signal write enable $\overline{WE}$ low and the control signal output enable $\overline{OE}$ high to thereby place the data output buffer 194 in a high impedance state and to couple the data bus 186 through the data input buffer 192 to the I/O lines 210. The external circuitry then provides a row address on the address bus 182 which is strobed, latched, and decoded to activate the word line WL of the addressed memory cell in the memory cell array 206 as previously described for a read operation. The external circuitry likewise provides a column address on the address bus 182 which is strobed, latched, and decoded also as previously described for a read operation. As previously described, when the column address latch 196 outputs the latched column address the ATD 197 outputs a pulse signal to the equilibration driver circuit 100 which in turn outputs the equilibrate signal EQIO to the circuit 204 to cause equilibration of the I/O lines 210. During a write operation, the control circuit 190 outputs the stop equilibrate signal SEQ to the equilibration driver circuit 100 which causes the circuit 100 to terminate the equilibration cycle. As previously described, the column decoder 200 decodes the column address and activates the column select signal CSEL of the columns containing the addressed memory cells. When the column select signal CSEL is activated, the data on the data bus 186 to be written to the addressed memory cells is coupled through the data input buffer 192 to the I/O lines 210 and from the I/O lines 210 through the circuit 204 to the digit lines 208 of the addressed memory cells in the memory cell array 206. The word line WL of the addressed memory cells is deactivated while the data to be written to these cells is on the respective digit lines 208 to thereby store the data in the addressed memory cells.

Figure 7:
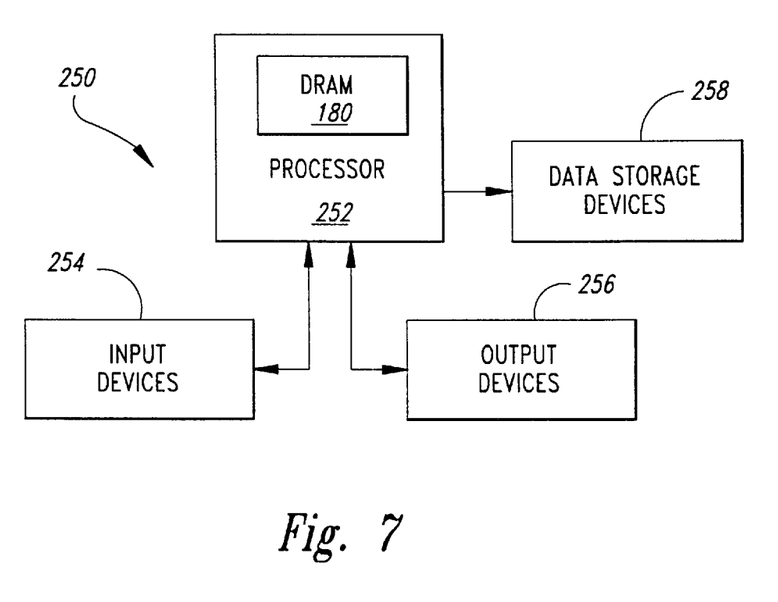
FIG. 7 is a block diagram of a computer system which includes the DRAM of FIG. 6.

FIG. 7 is a block diagram of a computer system 250 which uses the DRAM 180 of FIG. 6. The computer system 250 includes a processor 252 for performing various computing functions, such as executing specific software to perform specific calculations or tasks. In addition, the computer system 250 includes one or more input devices 254, such as a keyboard or a mouse, coupled to the processor 252 to allow an operator to interface with the computer system. Typically, the computer system 250 also includes one or more output devices 256 coupled to the processor 252, such output devices typically being a printer or a video terminal. One or more data storage devices 258 are also typically coupled to the processor 252 to store data or retrieve data from the external storage media (not shown). Examples of typical storage devices 258 include hard and floppy disks, tape cassettes, and compact disk read-only memories (CD-ROMs). The processor 252 is typically coupled to the DRAM 180 through a control bus, a data bus, and an address bus to provide for writing data to and reading data from the DRAM.

It is to be understood that even though various embodiments and advantages of the present invention have been set forth in the foregoing description, the above disclosure is illustrative only, and changes may be made in detail, and yet remain within the broad principles of the invention. For example, although the equilibration circuit is described as being used to equilibrate the I/O lines of a DRAM, it may also be used to equilibrate the I/O lines or similar signal paths in a static RAM or other memory device. Therefore, the present invention is to be limited only by the appended claims.

I claim:

1. An equilibration driver circuit for providing an equilibration signal on a node in a memory de v ice, the node being coupled to an equilibration circuit in the memory device which equalizes voltage levels on complementary pairs of input/output lines in the memory device in response to the equilibration signal, the equilibration driver circuit comprising a switching circuit having an equilibration terminal coupled to the node and having an input terminal adapted to receive a pulse signal indicating a transition of a column address signal from one logic level to the complementary logic level, the switching circuit operable in a first mode to couple the equilibration terminal to a first reference voltage in response to the pulse signal being active, the switching circuit coupling the equilibration terminal through a low impedance circuit to a second reference voltage in a second mode subsequent to the first mode and coupling the equilibration terminal through a high impedance circuit to the second reference voltage in a third mode subsequent to the second mode.

2. The equilibration driver circuit of claim 1 wherein the switching circuit operates in the first mode for a period beginning at the start of the pulse signal and ending after the termination of the pulse signal.

3. The equilibration driver circuit of claim 1 wherein the low impedance circuit includes a first MOS transistor configured to have a first channel impedance and the high impedance circuit includes a second MOS transistor configured to have a second channel impedance which is greater than the first channel impedance.

4. The equilibration driver circuit of claim 3 wherein the switching circuit includes a PMOS transistor having its drain and source terminals coupled to the equilibration terminal and the first reference voltage, respectively, and its gate terminal adapted to receive the pulse signal, the PMOS transistor configured to have a third channel impedance which is smaller than the second channel impedance.

5. The equilibration driver circuit of claim 1 wherein the memory device is a random access memory.

6. The equilibration device of claim 5 wherein the memory device is a dynamic random access memory.

7. An equilibration driver circuit for providing an equilibration signal on a node in a memory device, the node being coupled to an equilibration circuit in the memory device which equalizes voltage levels on complementary pairs of input/output lines in the memory device in response to the equilibration signal, comprising:

an address transition detection circuit having an input terminal adapted to receive a column address signal and an output terminal on which a pulse signal is generated in response to a transition of the column address signal from one logic level to the complementary logic level; and a switching circuit having an input terminal coupled to the output terminal of the address transition detection circuit and an equilibration terminal coupled to the node, the switching circuit operable in a first mode to couple the equilibration terminal to a first reference voltage in response to the pulse signal being output by the address transition detection circuit, operable in a second mode to couple the equilibration terminal through a low impedance circuit to a second reference voltage, and operable in a third mode to couple the equilibration terminal through a high impedance circuit to the second reference voltage.

8. The equilibration driver circuit of claim 7 wherein the switching circuit operates in the first mode for a period beginning at the start of the pulse signal from the address transition detection circuit and ending after the termination of the pulse signal.

9. The equilibration driver circuit of claim 7 wherein the switching circuit operates sequentially in the first, second, and third modes.

10. The equilibration driver circuit of claim 7 wherein the low impedance circuit includes a first MOS transistor configured to have a first channel impedance and the high impedance circuit includes a second MOS transistor configured to have a second channel impedance which is greater than the first channel impedance.

11. The equilibration driver circuit of claim 10 wherein the switching circuit includes a PMOS transistor having its drain and source terminals coupled to the equilibration terminal and the first reference voltage, respectively, and its gate terminal coupled to the pulse terminal of the address transition detection circuit, the PMOS transistor configured to have a third channel impedance which is less than the second channel impedance.

12. The equilibration driver circuit of claim 10 wherein the memory device is a random access memory.

13. The equilibration device of claim 12 wherein the memory device is a dynamic random access memory.

14. An equilibration driver circuit for providing an equilibration signal on a node in a memory device, the node being coupled to an equilibration circuit in the memory device which equalizes voltage levels on complementary pairs of input/output lines in the memory device in response to the equilibration signal, the equilibration driver circuit comprising a switching circuit having an equilibration terminal coupled to the node and an input terminal adapted to receive a pulse signal indicating a transition of a column address signal from one logic level to the complementary logic level, the switching circuit operable to couple the node to a supply voltage for a first period beginning when the pulse signal is received, to couple the node through a low impedance circuit to a second reference voltage for a second period beginning after the first period, and to couple the node through a high impedance circuit to the second reference voltage for a third period.

15. The equilibration driver circuit of claim 14 wherein the first period ends after the termination of the pulse signal.

16. The equilibration driver circuit of claim 14 wherein the third period includes at least a portion of the second period and a period after the second period has ended.

17. The equilibration driver circuit of claim 14 wherein the first and second periods are predetermined.

18. The equilibration driver circuit of claim 14 wherein the memory device is a random access memory.

19. The equilibration device of claim 18 wherein the memory device is a dynamic random access memory.

20. An equilibration driver circuit for providing an equilibration signal on a node in a memory device, the node being coupled to an equilibration circuit in the memory device which equalizes voltage levels on complementary pairs of input/output lines in the memory device in response to the equilibration signal, the equilibration driver circuit comprising a switching circuit having an equilibration terminal coupled to the node and an input terminal adapted to receive a pulse signal indicating a transition of a column address signal from one logic level to the complementary logic level, the switching circuit operable to couple the node through a high impedance circuit to a reference voltage until the pulse signal is received, and upon receiving the pulse signal to first couple the node to a supply voltage, then couple the node through a low impedance circuit to the reference voltage, and thereafter couple the node through the high impedance circuit to the reference voltage.

21. The equilibration driver circuit of claim 20 wherein the switching circuit couples the node to the supply voltage for a first predetermined period and couples the node through the low impedance circuit to the reference voltage for a second predetermined period.

22. The equilibration driver circuit of claim 20 wherein the memory device is a random access memory.

23. The equilibration device of claim 22 wherein the memory device is a dynamic random access memory.

24. An equilibration driver circuit for providing an equilibration signal on a node in a memory device, the node being coupled to an equilibration circuit in the memory device which equalizes voltages levels on complementary pairs of input/output (I/O) lines in the memory device in response to the equilibration signal, comprising:

a plurality of address transition detection(ATD) circuits, each ATD circuit having an input terminal adapted to receive a column address signal and an output terminal on which a pulse signal is generated in response to a transition of the respective column address signal from one logic level to the complementary logic level; and a switching circuit having an input terminal coupled to the pulse terminal and an equilibration terminal coupled to the node, the switching circuit operable in a first mode to couple the equilibration terminal to a first reference voltage in response to the pulse signal being output by any of the ATD circuits, the switching circuit operable in a second mode to couple the equilibration terminal through a low impedance circuit to a second reference voltage, and operable in a third mode to couple the equilibration terminal through a high impedance circuit to the second reference voltage.

25. The equilibration driver circuit of claim 24 wherein the switching circuit operates in the first mode for a first period beginning at the start of the first pulse signal output from one of the plurality of address transition detection circuits and ending after the termination of the final pulse signal output from one of the plurality of address transition detection circuits.

26. The equilibration driver circuit of claim 24 wherein the low impedance circuit includes a first MOS transistor configured to have a first channel impedance and the high impedance circuit includes a second MOS transistor configured to have a second channel impedance which is greater than the first channel impedance.

27. The equilibration driver circuit of claim 26 wherein the switching circuit includes a PMOS transistor having its drain and source terminals coupled to the equilibration terminal and the first reference voltage, respectively, and its gate terminal coupled to the pulse terminal of the address transition detection circuit, the PMOS transistor configured to have a third channel impedance which is less than the second channel impedance.

28. The equilibration driver circuit of claim 24 wherein the memory device is a random access memory.

29. The equilibration device of claim 28 wherein the memory device is a dynamic random access memory.

30. A circuit for equilibrating input/output(I/O) lines in a memory device, comprising:

an address transition detection circuit having an input terminal adapted to receive a column address signal and an output terminal on which a pulse signal is generated in response to a transition of the column address signal from one logic level to the complementary logic level;

a switching circuit having an input terminal coupled to the pulse terminal and an equilibration terminal coupled to the node, the switching circuit operable in a first mode to couple the equilibration terminal to a first reference voltage in response to the pulse signal being output by the address transition detection circuit, operable in a second mode to couple the equilibration terminal through a low impedance circuit to a second reference voltage subsequent to the first mode, and operable in a third mode to couple the equilibration terminal through a high impedance circuit to the second reference voltage subsequent to the second mode; and a bias and equilibration circuit coupled to a pair of complementary I/O lines and having an enable terminal coupled to the equilibration terminal, the bias and equilibration circuit operable to equalize the voltage levels on the I/O lines to a predetermined bias voltage level when the switching circuit operates in the first mode.

31. The equilibration driver circuit of claim 30 wherein the switching circuit operates in the first mode for a period beginning at the start of the pulse signal from the address transition detection circuit and ending after the termination of the pulse signal.

32. The equilibration driver circuit of claim 30 wherein the low impedance circuit includes a first MOS transistor configured to have a first channel impedance and the high impedance circuit includes a second MOS transistor configured to have a second channel impedance which is greater than the first channel impedance.

33. The equilibration driver circuit of claim 32 wherein the switching circuit includes a PMOS transistor having its drain and source terminals coupled to the equilibration terminal and the first reference voltage, respectively, and its gate terminal coupled to the pulse terminal of the address transition detection circuit, the PMOS transistor configured to have a third channel impedance which is less than the second channel impedance.

34. The equilibration driver circuit of claim 30 wherein the memory device is a random access memory.

35. The equilibration device of claim 34 wherein the memory device is a dynamic random access memory.

36. A circuit for equilibrating input/output(I/O) lines in a memory device, comprising:

an address transition detection circuit having an input terminal adapted to receive a column address signal and an output terminal on which a pulse signal is generated in response to a transition of the column address signal from one logic level to the complementary logic level;

a bias and equilibration circuit coupled to a pair of complementary I/0 lines in the DRAM and having an equilibration terminal adapted to receive an equilibration signal, the bias and equilibration circuit operable to equalize the voltage levels on the I/O lines to a predetermined bias voltage level when the equilibration signal is active;

a first switching circuit having a first signal terminal coupled to a first reference voltage, a second signal terminal coupled to the equilibration terminal, and a control terminal coupled to the output terminal of the address transition detection circuit, the first switching circuit operable to couple the first signal terminal to the second signal terminal when the pulse signal is active;

a second switching circuit having a first signal terminal coupled to the equilibration terminal, a second signal terminal coupled to a second reference voltage, and a control terminal adapted to receive a first control signal, the second switching circuit operable to couple the first signal terminal through a low impedance circuit to the second signal terminal when the first control signal is active;

a third switching circuit having a first signal terminal coupled to the equilibration terminal, a second signal terminal coupled to the second reference voltage, and a control terminal adapted to receive a second control signal, the second switching circuit operable to couple the first signal terminal through a high impedance circuit to the second signal terminal when the second control signal is active; and a control circuit coupled to the pulse terminal of the address transition detection circuit and to the control terminals of the second and third switching circuits, the control circuit operable to activate the first control signal for a first period after receiving the pulse signal, and to activate the second control signal for a second period including a period after termination of the first period.

37. The circuit of claim 36 wherein the first period begins upon termination of the pulse signal and the second period begins upon termination of the first period.

38. The circuit of claim 36 wherein the first period begins a predetermined delay time after termination of the pulse signal.

39. The circuit of claim 36 wherein the first switching circuit comprises a PMOS transistor and the first reference voltage is a supply voltage $V_{CC}$ and the second switching circuit comprises an NMOS transistor and the second reference voltage is approximately zero volts.

40. The circuit of claim 36 wherein the third switching circuit comprises three NMOS transistors having their source and drain terminals connected in series between the equilibration terminal and the second reference voltage.

41. The equilibration driver circuit of claim 36 wherein the memory device is a random access memory.

42. The equilibration device of claim 41 wherein the memory device is a dynamic random access memory.

43. A memory device, comprising:

an address bus;

a control bus;

a data bus;

an address decoder coupled to the address bus;

a control circuit coupled to the data bus;

a read/write circuit coupled to the data bus;

a memory-cell array coupled to the address decoder, control circuit, and read/write circuit; and an equilibration driver circuit for providing an equilibration signal on a node in the memory device, the node being coupled to an equilibration circuit in the memory device which equalizes voltage levels on complementary pairs of input/output lines in the memory device in response to the equilibration signal, the equilibration driver circuit comprising, an address transition detection circuit having an input terminal adapted to receive a column address signal and an output terminal on which a pulse signal is generated in response to a transition of the column address signal from one logic level to the complementary logic level, and a switching circuit having an input terminal coupled to the output terminal and an equilibration terminal coupled to the node, the switching circuit operable in a first mode to couple the equilibration terminal to a first reference voltage in response to the pulse signal being output by the address transition detection circuit, operable in a second mode to couple the equilibration terminal through a low impedance circuit to a second reference voltage, and operable in a third mode to couple the equilibration terminal through a high impedance circuit to the second reference voltage.

44. The memory device of claim 43 wherein the memory device is a dynamic random access memory, and wherein each memory cell comprises:

a storage element having a first storage terminal and a second storage terminal, the second storage terminal coupled to a reference voltage source of approximately $V_{cc}/2$; and a memory switch circuit having a control terminal coupled to an associated row line, a first data terminal coupled to the first storage terminal of the storage element, and a second data terminal coupled to one of the associated first and second complementary digit lines.

45. A computer system, comprising:

a data input device;

a data output device; and a processor coupled to the data input and output devices, the processor including a memory device that includes an equilibration driver circuit for providing an equilibration signal on a node in the memory device, the node being coupled to an equilibration circuit in the memory device which equalizes voltage levels on complementary pairs of input/output lines in the memory device in response to the equilibration signal, the equilibration driver circuit comprising, an address transition detection circuit having an input terminal adapted to receive a column address signal and an output terminal on which a pulse signal is generated in response to a transition of the column address signal from one logic level to the complementary logic level, and a switching circuit having an input terminal coupled to the output terminal and an equilibration terminal coupled to the node, the switching circuit operable in a first mode to couple the equilibration terminal to a first reference voltage in response to the pulse signal being output by the address transition detection circuit, operable in a second mode to couple the equilibration terminal through a low impedance circuit to a second reference voltage, and operable in a third mode to couple the equilibration terminal through a high impedance circuit to the second reference voltage.

46. The computer system of claim 45 wherein the memory device is a dynamic random access memory, and wherein each memory cell comprises:

a storage element having a first storage terminal and a second storage terminal, the second storage terminal coupled to a reference voltage source of approximately $V_{cc}/2$; and a memory switch circuit having a control terminal coupled to an associated row line, a first data terminal coupled to the first storage terminal of the storage element, and a second data terminal coupled to one of the associated first and second complementary digit lines.

47. A method for providing an equilibration signal in a memory device, the equilibration signal, when active, causing equilibration of complementary pairs of input/output (I/O) lines in the memory device, the method comprising the steps of:

detecting a transition of a column address signal from one logic state to a complementary logic state;

coupling an internal node of the memory device to a first reference voltage when a transition of the column address signal is detected to thereby provide an active equilibration signal on the node;

coupling the internal node through a low impedance circuit to a second reference voltage after the active equilibration signal has been provided on the internal node to thereby provide an inactive equilibration signal on the node; and coupling the internal node through a high impedance circuit to the second reference voltage for a period including after the low impedance circuit is no longer coupling the internal node to the second reference voltage to thereby maintain an inactive equilibration signal on the node.

48. The method of claim 47 wherein the step of coupling the internal node through a high impedance circuit is performed immediately after the step of coupling the internal node through a low impedance circuit and immediately before the step of coupling the internal node of the memory device to the first reference voltage.

49. A method for equilibrating complementary pairs of input/output lines in a memory device, the method comprising the steps of:

detecting a transition of a column address signal from one logic state to a complementary logic state;

coupling an internal node of the memory device to a first reference voltage when a transition of the column address signal is detected to thereby provide an active equilibration signal on the node;

equilibrating the input/output lines in response to the active equilibration signal;

coupling the internal node through a low impedance circuit to a second reference voltage after the active equilibration signal has been provided on the internal node to thereby provide an inactive equilibration signal on the node; and coupling the internal node through a high impedance circuit to the second reference voltage for a period including after the low impedance circuit is no longer coupling the internal node to the second reference voltage to thereby maintain an inactive equilibration signal on the node.

50. The method of claim 49 wherein the step of detecting includes detecting transition of a column address signal from one logic state to a complementary logic state for a plurality of column address signals.

51. The method of claim 49 wherein the step of coupling the internal node through a low impedance circuit includes the step of coupling the internal node through a low impedance circuit to a second reference voltage a predetermined delay time after a final one of the plurality of column address signal transitions is detected.

52. A method for providing an equilibration signal in a memory device in response to detecting a transition of a column address signal from one logic state to a complementary logic state, the equilibration signal, when active, causing equilibration of complementary pairs of input/output lines in the memory device, the method comprising the steps of:

coupling an internal node of the memory device to a first reference voltage through a high impedance circuit when no transition of the column address signal is detected to thereby maintain an inactive equilibration signal on the node;

coupling the internal node of the memory device to a second reference voltage for a first period beginning when a transition of the column address signal is detected to thereby provide an active equilibration signal on the node; and coupling the internal node of the memory device to the first reference voltage through a low impedance circuit for a second period after the first period to thereby provide an inactive equilibration signal on the node.

53. The method of claim 52 wherein the step of coupling an internal node of the memory device to a first reference voltage through a high impedance circuit begins during the second period and continues after the end of the second period.

54. The method of claim 52 wherein the first and second periods are predetermined periods.

* * * * *

UNITED STATES PATENT AND TRADEMARK OFFICE
CERTIFICATE OF CORRECTION

PATENT NO. : 5,835,440
DATED : November 10, 1998
INVENTOR(S) : Manning

It is certified that error appears in the above-identified patent and that said Letters Patent is hereby corrected as shown below:

Column 9, line 19      "to"      -- $t_o$ --

Column 10, line 21      "$V_{cc\ and}$"      -- $V_{cc}$ and --

Column 11, line 60      "to"      -- $t_o$ --

Signed and Sealed this

Twenty-ninth Day of May, 2001

Attest:

NICHOLAS P. GODICI

Attesting Officer      Acting Director of the United States Patent and Trademark Office